(12) United States Patent
Muto et al.

(10) Patent No.: US 10,497,631 B2
(45) Date of Patent: Dec. 3, 2019

(54) INSULATED DC-DC CONVERTER

(71) Applicant: Murata Manufacturing Co., Ltd., Nagaokakyo-shi, Kyoto-fu (JP)

(72) Inventors: Takami Muto, Nagaokakyo (JP); Takayuki Yamamoto, Nagaokakyo (JP); Takayoshi Nishiyama, Nagaokakyo (JP); Naoto Kinoshita, Nagaokakyo (JP); Yuki Abura, Nagaokakyo (JP); Yoshihiro Matsumoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 4 days.

(21) Appl. No.: 15/876,246

(22) Filed: Jan. 22, 2018

(65) Prior Publication Data

US 2018/0145598 A1 May 24, 2018

Related U.S. Application Data

(63) Continuation of application No. PCT/JP2016/063258, filed on Apr. 27, 2016.

(30) Foreign Application Priority Data

Aug. 3, 2015 (JP) ................... 2015-153690

(51) Int. Cl.
*H01L 23/04* (2006.01)
*H02M 3/335* (2006.01)
(Continued)

(52) U.S. Cl.
CPC .............. *H01L 23/04* (2013.01); *H01L 25/07* (2013.01); *H01L 25/18* (2013.01); *H02M 3/33523* (2013.01); *H02M 3/33576* (2013.01)

(58) Field of Classification Search
CPC ........... H02M 7/003; H01L 23/04–049; H05K 1/0292–0295
See application file for complete search history.

(56) References Cited

U.S. PATENT DOCUMENTS 6,301,127 B1   10/2001   Kobayashi
7,504,907 B2 *  3/2009   Fujiki ................. H01F 17/0013
                                               333/112
(Continued)

FOREIGN PATENT DOCUMENTS

JP     07-99777 A      4/1995
JP    07-288978 A     10/1995
(Continued)

OTHER PUBLICATIONS

Official Communication issued in International Patent Application No. PCT/JP2016/063258, dated Jul. 12, 2016.
(Continued)

*Primary Examiner* — Gary L Laxton
*Assistant Examiner* — Peter M Novak
(74) *Attorney, Agent, or Firm* — Keating & Bennett, LLP

(57) ABSTRACT

An insulated DC-DC converter includes a substrate, a transformer, a primary side electronic component and a primary side wire defining a primary side circuit together with a primary winding, a secondary side electronic component and a secondary side wire defining a secondary side circuit insulated from the primary side circuit, together with a secondary winding, the secondary side electronic component including a choke coil, and an inter-circuit electronic component and an inter-primary side circuit wire connected over the primary side circuit and the secondary side circuit while insulating the primary side circuit and the secondary side circuit from each other in a DC manner. The choke coil spaced apart from one principal surface of the substrate, and at least one of the primary side electronic component and the
(Continued)

inter-circuit electronic component and at least one of a portion of the primary side wire and a portion of the inter-primary side circuit wire are disposed between the choke coil and the one principal surface of the substrate.

16 Claims, 5 Drawing Sheets

(51) Int. Cl.
*H01L 25/18* (2006.01)
*H01L 25/07* (2006.01)

(56) References Cited

U.S. PATENT DOCUMENTS

| | | | |
|---|---|---|---|
| 9,490,716 B2 * | 11/2016 | Tseng | H02M 3/33592 |
| 2003/0039092 A1 | 2/2003 | Kanouda et al. | |
| 2008/0002441 A1 * | 1/2008 | Allinder | H02M 3/33592 |
| | | | 363/21.14 |
| 2009/0243777 A1 * | 10/2009 | Toi | H01F 19/06 |
| | | | 336/192 |
| 2010/0202160 A1 * | 8/2010 | Kim | H01F 27/38 |
| | | | 363/16 |
| 2015/0029759 A1 * | 1/2015 | Takemoto | B60L 11/00 |
| | | | 363/17 |
| 2015/0138844 A1 * | 5/2015 | Karlsson | H02M 3/158 |
| | | | 363/21.1 |
| 2017/0085187 A1 * | 3/2017 | Ishigaki | H02M 3/33546 |
| 2019/0110355 A1 * | 4/2019 | Sato | H02M 3/28 |

FOREIGN PATENT DOCUMENTS

| | | |
|---|---|---|
| JP | 2001-103756 A | 4/2001 |
| JP | 2002-142457 A | 5/2002 |
| JP | 2003-070235 A | 3/2003 |
| JP | 2004-022486 A | 1/2004 |
| JP | 2010-268623 A | 11/2010 |
| JP | 2015-043683 A | 3/2015 |

OTHER PUBLICATIONS

"Power Electronics Circuit", Institute of Electrical Engineers of Japan / Semiconductor Power Conversion System Research Technical Committee, Nov. 30, 2000, 4 pages.

* cited by examiner they INSULATED DC-DC CONVERTER

CROSS REFERENCE TO RELATED APPLICATIONS

This application claims the benefit of priority to Japanese Patent Application No. 2015-153690 filed on Aug. 3, 2015 and is a Continuation Application of PCT Application No. PCT/JP2016/063258 filed on Apr. 27, 2016. The entire contents of each application are hereby incorporated herein by reference.

BACKGROUND OF THE INVENTION

1. Field of the Invention

The present invention relates to an insulated DC-DC converter in which electronic components, such as a transformer and a choke coil, are mounted on a substrate.

2. Description of the Related Art

Regarding recent electronic devices, such as a portable electronic device, whereas the area of a motherboard has decreased with size reduction, the number of electronic components and electronic component modules mounted on the motherboard has increased with desired increased functionality. Thus, the electronic components and the electronic component modules are required to occupy reduced areas on the motherboard.

An insulated DC-DC converter that converts a DC voltage to another DC voltage is one of the electronic component modules, and is configured such that electronic components, such as a transformer and a choke coil, are mounted on a substrate. The circuit configuration of a general insulated DC-DC converter is disclosed, for example, in "Power Electronics Circuit", edited by the Institute of Electrical Engineers of Japan/Semiconductor Power Conversion System Research Technical Committee, published by Ohmsha, Ltd., Nov. 30, 2000, first edition, first printing, pp. 267-269 (hereinafter referred to as "Power Electronics Circuit").

A circuit diagram 600 of an insulated DC-DC converter disclosed in "Power Electronics Circuit" is shown in FIG. 6. The circuit in FIG. 6 is configured to include a control circuit 602a, a gate drive circuit 602b, a switching element 603, an output voltage detection circuit 606, diodes 610a and 610b, a transformer 613, a choke coil 614, and a photocoupler 615. The switching element 603 is a field-effect transistor (hereinafter, sometimes abbreviated as FET). The transformer 613 includes a primary winding 613P and a secondary winding 613S.

The circuit in FIG. 6 includes a primary side circuit, a secondary side circuit, and an inter-circuit electronic component connected over the primary side circuit and the secondary side circuit. The primary side circuit includes the primary winding 613P of the transformer 613, and primary side electronic components and a primary side wire connected to the primary winding 613P. In addition, the secondary side circuit includes the secondary winding 613S of the transformer 613, and secondary side electronic components and a secondary side wire connected to the secondary winding 613S.

In the circuit in FIG. 6, for example, the control circuit 602a, the gate drive circuit 602b, and the switching element 603 correspond to the primary side electronic components, and a wire connecting these components corresponds to the primary side wire. In addition, for example, the output voltage detection circuit 606, the diodes 610a and 610b, and the choke coil 614 correspond to the secondary side electronic components, and a wire connecting these components corresponds to the secondary side wire. Furthermore, the photocoupler 615 corresponds to the inter-circuit electronic component connected over the primary side circuit and the secondary side circuit.

Among the secondary side electronic components of the insulated DC-DC converter, the choke coil is an electronic component that is particularly larger than the other electronic components and that has a large occupation area on the substrate. Therefore, in order to two-dimensionally mount the electronic components of the insulated DC-DC converter, it is necessary to use a substrate having a large area. As a result, the existing insulated DC-DC converter has a large occupation area on a motherboard.

SUMMARY OF THE INVENTION

Preferred embodiments of the present invention provide insulated DC-DC converters having a small occupation area on a motherboard.

In preferred embodiments of the present invention, in order to obtain an insulated DC-DC converter having a small mounting area, a mounting manner of a choke coil that is a secondary side electronic component of the insulated DC-DC converter is improved.

An insulated DC-DC converter according to a preferred embodiment of the present invention includes a substrate, a transformer, a primary side electronic component, a primary side wire, a secondary side electronic component including a choke coil, a secondary side wire, an inter-circuit electronic component, and an inter-primary side circuit wire.

The substrate includes one principal surface and another principal surface. The transformer includes a primary winding and a secondary winding. A primary side electronic component and a primary side wire define a primary side circuit together with the primary winding of the transformer. A secondary side electronic component including a choke coil, and a secondary side wire define a secondary side circuit insulated from the primary side circuit, together with the secondary winding of the transformer. The inter-circuit electronic component is connected over the primary side circuit and the secondary side circuit while insulating the primary side circuit and the secondary side circuit from each other in a DC manner. The inter-primary side circuit wire connects the inter-circuit electronic component and the primary side circuit.

The choke coil is spaced apart from the one principal surface of the substrate. At least one electronic component selected from among the primary side electronic component and the inter-circuit electronic component and at least one selected from a portion of the primary side wire and a portion of the inter-primary side circuit wire is disposed between the choke coil and the one principal surface of the substrate.

In the insulated DC-DC converter described above, at least one selected from the above components is disposed between the choke coil and the one principal surface of the substrate. As described above, among the electronic components defining the insulated DC-DC converter, the transformer and the choke coil have larger occupation areas on the substrate. Among these components, when the choke coil is spaced apart from the one principal surface of the substrate, it is possible to effectively use the space below the choke coil.

That is, in a preferred embodiment of the present invention, since at least one selected from the above components is disposed in the space below the choke coil, it is possible to reduce the area of the substrate by the area occupied by these components. As a result, it is possible to reduce the size of the substrate of the insulated DC-DC converter, and further it is possible to decrease the occupation area of the insulated DC-DC converter on a motherboard.

An insulated DC-DC converter according to a preferred embodiment of the present invention preferably includes the following features. Specifically, on the one principal surface of the substrate, a region in which the primary side wire and a connection land electrically connected to the primary side electronic component are disposed is defined as a primary side region. In addition, a region in which the secondary side wire and a connection land electrically connected to the secondary side electronic component are disposed is defined as a secondary side region. Furthermore, a region that is located between the primary side region and the secondary side region and insulates the primary side circuit and the secondary side circuit from each other and in which the transformer, the inter-circuit electronic component, and the inter-primary side circuit wire are disposed is defined as an insulation region.

The choke coil is disposed over the insulation region so as to be spaced apart from the one principal surface of the substrate by a first terminal and a second terminal of the choke coil and a support that is not electrically connected to the first terminal and the second terminal and that is disposed on the primary side region.

In the insulated DC-DC converter described above, the choke coil is disposed over the insulation region so as to be spaced apart from the one principal surface of the substrate by the first terminal and the second terminal and the support disposed on the primary side region.

In an existing insulated DC-DC converter, an insulation region provided between a primary side region and a secondary side region for insulation is a dead space on a substrate. However, in a preferred embodiment of the present invention, since the choke coil is disposed over the insulation region which is a dead space, it is possible a portion of the occupation area of the choke coil to be provided in the insulation region. As a result, it is possible to reduce the size of the substrate of the insulated DC-DC converter, and further it is possible to decrease the occupation area of the insulated DC-DC converter on the motherboard.

The choke coil is the secondary side electronic component. Since the support is not electrically connected to the first terminal and the second terminal connected to the secondary side circuit, a short circuit between the primary side circuit and the secondary side circuit does not occur even when the support is disposed on the primary side region.

An insulated DC-DC converter according to a preferred embodiment of the present invention further preferably includes the following features. Specifically, at least the inter-circuit electronic component is disposed between the choke coil and the one principal surface of the substrate. The inter-circuit electronic component is at least one selected from a capacitor, an isolator, and a photocoupler.

In the insulated DC-DC converter described above, the inter-circuit electronic component, which insulates the primary side circuit and the secondary side circuit from each other in a DC manner, is disposed in the space below the choke coil. Here, the capacitor causes noise generated in the primary side circuit to flow to the secondary side circuit so as to drop to ground. In addition, the isolator exchanges signals between the primary side electronic component and the secondary side electronic component in a state of insulating the primary side electronic component and the secondary side electronic component from each other in a DC manner. Furthermore, the photocoupler optically exchanges signals between the primary side electronic component and the secondary side electronic component.

In a preferred embodiment of the present invention, it is possible to reduce the area of the substrate by the area occupied by the above electronic component. As a result, it is possible to reduce the size of the substrate of the insulated DC-DC converter, and further it is possible to decrease the occupation area of the insulated DC-DC converter on the motherboard.

An insulated DC-DC converter according to a preferred embodiment of the present invention further preferably includes the following features. Specifically, at least the primary side electronic component is disposed between the choke coil and the one principal surface of the substrate. The primary side electronic component is a switching element.

In the insulated DC-DC converter described above, the switching element among the primary side electronic components is disposed in a space below the choke coil. Here, for example, a field-effect transistor (hereinafter, sometimes abbreviated as FET) may preferably be used as the switching element.

In a preferred embodiment of the present invention, it is possible to reduce the area of the substrate by the area occupied by the electronic component. As a result, it is possible to reduce the size of the substrate of the insulated DC-DC converter, and further it is possible to decrease the occupation area of the insulated DC-DC converter on the motherboard.

An insulated DC-DC converter according to a preferred embodiment of the present invention in which the switching element among the primary side electronic components is disposed in the space below the choke coil preferably includes the following features. Specifically, a radio wave absorber is disposed between the choke coil and the switching element.

In the insulated DC-DC converter described above, the radio wave absorber is disposed between the choke coil and the switching element. It is possible to reduce or prevent the influence of noise generated from the choke coil, on the switching element.

In insulated DC-DC converters according to preferred embodiments of the present invention, it is possible to reduce the area of the substrate by the area occupied by at least one electronic component selected from among the primary side electronic component and the inter-circuit electronic component and at least one selected from among the portion of the primary side wire and the portion of the inter-primary side circuit wire. As a result, it is possible to reduce the size of the substrate of the insulated DC-DC converter, and further it is possible to decrease the occupation area of the insulated DC-DC converter on the motherboard.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the features of the present invention will be described in more detail by describing preferred embodiments of the present invention.

First Preferred Embodiment

An insulated DC-DC converter 100 according to a first preferred embodiment of the present invention will be described with reference to FIGS. 1A and 1B and FIG. 2.

Figure 1A:
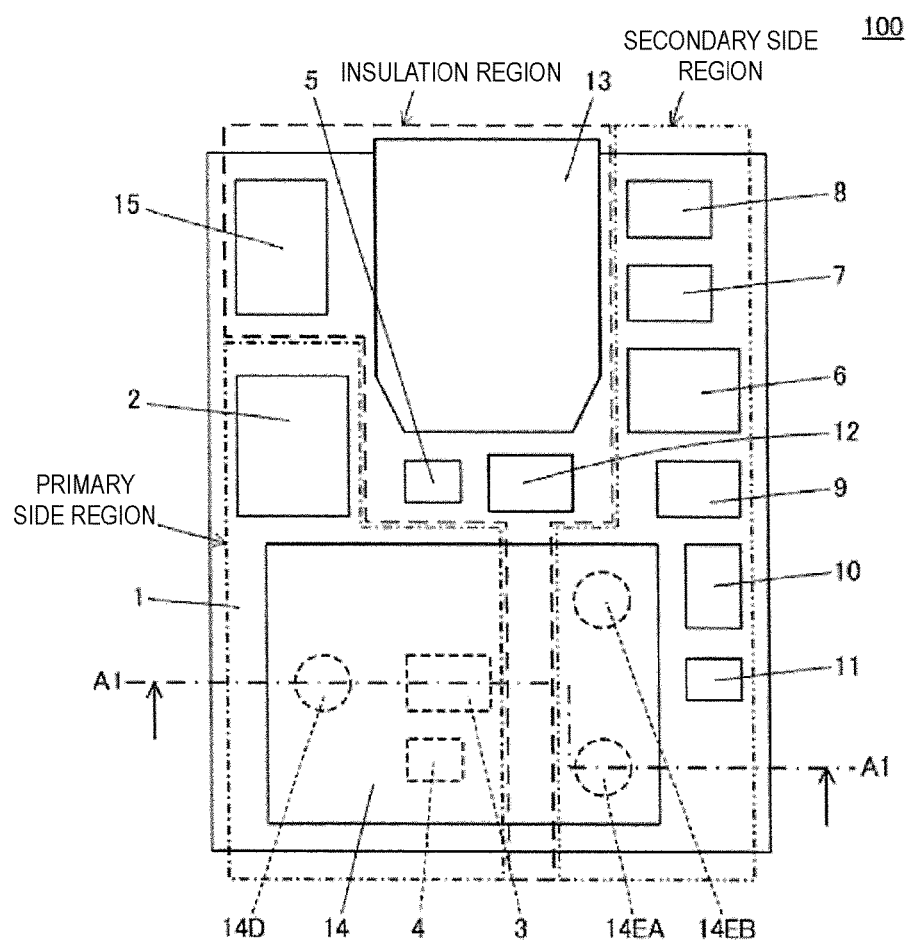
FIG. 1A is a top view and FIG. 1B is a cross-sectional view of an insulated DC-DC converter 100 according to a first preferred embodiment of the present invention.

FIG. 1A is a top view of the insulated DC-DC converter 100. FIG. 1B is a cross-sectional view of the insulated DC-DC converter 100 taken along a plane including the line A1-A1 shown in FIG. 1A. In FIG. 1B, only elements the cross-sections of which appear are shown, and elements the cross-sections of which do not appear are not shown. A circuit diagram 200 shown in FIG. 2 is an example of the circuit diagram of the insulated DC-DC converter 100 shown in FIGS. 1A and 1B and represents the circuit configuration of a forward type insulated DC-DC converter.

The insulated DC-DC converter 100 includes a substrate 1, a transformer 13, primary side electronic components and a primary side wire W1, secondary side electronic components including a choke coil 14, a secondary side wire W2, inter-circuit electronic components, an inter-primary side circuit wire W3, and an inter-secondary side circuit wire. A DC power supply V is connected to the input side, and a load R is connected to the output side.

In the present preferred embodiment, the substrate 1 is a multilayer ceramic substrate that includes one principal surface and another principal surface and that includes a ceramic layer 1C and an internal conductor including a pattern conductor 1P and a via conductor 1V. The ceramic layer 1C preferably includes a ceramic material that is a Ba—Al—Si-based oxide, for example.

The internal conductor is preferably made of Cu, for example. Connection lands 1UA, 1UB, 1UC, and 1F and other connection lands that are not shown are provided on the one principal surface of the substrate 1. The connection lands are not shown in FIG. 1A. The connection land 1F is not electrically connected to the primary side wire W1 and the secondary side wire W2.

Mounting electrodes 1LA and 1LB and other mounting electrodes that are not shown are provided on the other principal surface of the substrate 1. The connection lands and the mounting electrodes are preferably made of Cu, for example. The connection lands and the mounting electrodes may include a Cu layer as a base and a plating layer, such as Ni or Sn, provided on the surface of the Cu layer.

The transformer 13 includes a primary winding 13P and a secondary winding 13S. The primary side electronic components and the primary side wire W1 define a primary side circuit together with the primary winding 13P of the transformer 13.

The primary side wire W1 relates to the primary side circuit among the connection lands, a surface conductor that is not shown, the internal conductor, and the mounting electrodes. The secondary side electronic components including the choke coil 14, and the secondary side wire W2 define, together with the secondary winding 13S of the transformer, a secondary side circuit insulated from the primary side circuit. The secondary side wire W2 relates to a secondary side circuit among the connection lands, a surface conductor that is not shown, the internal conductor, and the mounting electrodes. The inter-circuit electronic components are connected over the primary side circuit and the secondary side circuit while insulating the primary side circuit and the secondary side circuit from each other in a DC manner.

In the present preferred embodiment, the primary side electronic components are a control IC 2, a switching element 3, and a capacitor 4. The control IC 2 controls operation of the switching element 3. An FET is preferably used as the switching element 3, for example. The capacitor 4 eliminates a ripple component that may be included in the DC power supply V.

In the present preferred embodiment, the secondary side electronic components are an output voltage feedback circuit module 6, drive circuit modules 7 and 8, switching elements 9 and 10, a capacitor 11, and the choke coil 14. The output voltage feedback circuit module 6 is connected to the control IC 2 via a photocoupler 15 and feeds back variations of an output voltage to the control IC 2. The drive circuit modules 7 and 8 are connected to the control IC 2 via an isolator 12 and generate drive signals for the switching elements 9 and 10 under control of the control IC 2. FETs are preferably used as the switching elements 9 and 10, for example. The capacitor 11 smooths an output current.

The choke coil 14 includes a first terminal 14EA and a second terminal 14EB electrically connected to the secondary side connection lands on the one principal surface, and a support 14D connected to the connection land 1F. The choke coil 14 is disposed above the one principal surface of the substrate 1 so as to be spaced apart from the one principal surface by the first terminal 14EA, the second terminal 14EB, and the support 14D. In the present preferred embodiment, each of the first terminal 14EA, the second terminal 14EB, and the support 14D preferably has a columnar shape, but the shape thereof is not particularly limited.

The first terminal 14EA and the second terminal 14EB are preferably made of Cu, for example. It is possible to establish connection between the first terminal 14EA and the second terminal 14EB, and the connection lands (1UC and the like) by using solder S, for example. In the present preferred embodiment, the support 14D is a conductor and is preferably made of Cu, for example. In this case, it possible to establish connection between the support 14D and the connection land 1F simultaneously with the connections between the first terminal 14EA and the second terminal 14EB, and the connection lands.

In the present preferred embodiment, the inter-circuit electronic components are a capacitor 5, the isolator 12, and the photocoupler 15. The capacitor 5 is generally used to reduce radiation or external transmission of a noise component generated in the insulated DC-DC converter 100, and causes noise generated in the primary side circuit to flow to the secondary side circuit so as to drop to ground. In addition, the isolator 12 exchanges signals between the control IC 2 and the drive circuit modules 7 and 8 in a state of insulating the control IC 2 and the drive circuit modules 7 and 8 from each other in a DC manner. Furthermore, the photocoupler 15 optically exchanges signals between the control IC 2 and the output voltage feedback circuit module 6. A wire connecting the inter-circuit electronic components and the primary side circuit is referred to as a primary side circuit wire, and a wire connecting the inter-circuit electronic components and the secondary side circuit is referred to as a secondary side circuit wire.

Figure 1B:
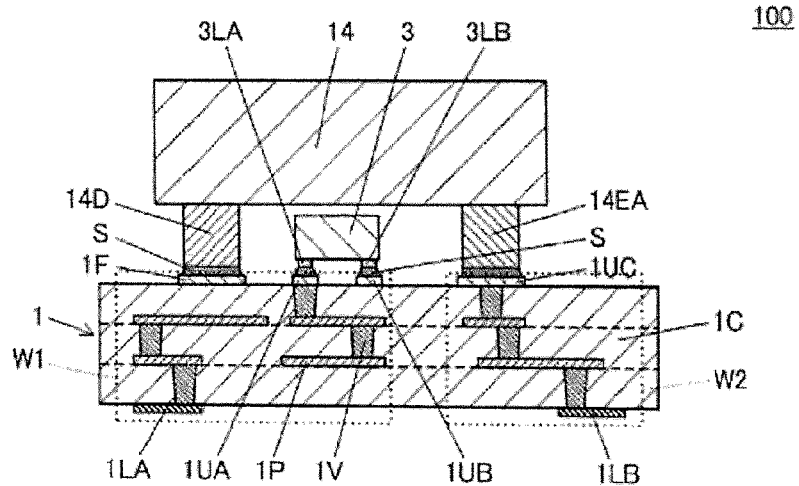
Figure 2:
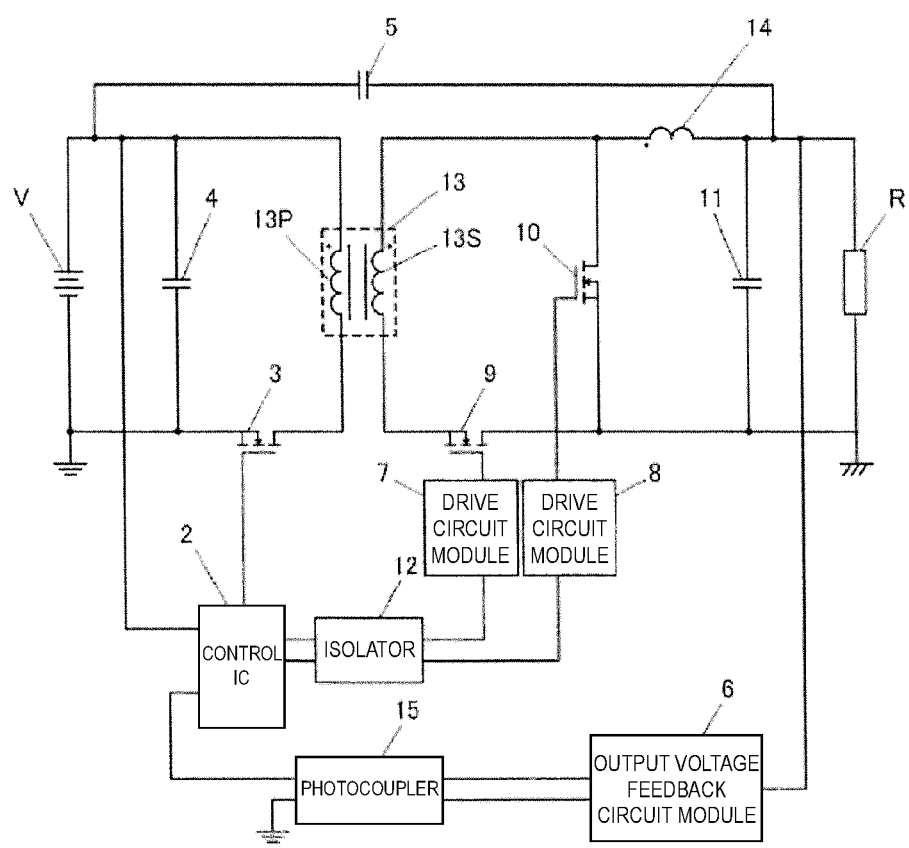
FIG. 2 is a circuit diagram 200 of the insulated DC-DC converter 100 shown in FIGS. 1A and 1B.

The primary side wire W1 and the connection lands electrically connected to the primary side electronic components shown in FIG. 1B are disposed in a region indicated as a primary side region in FIG. 1A. The secondary side wire W2 and the connection lands electrically connected to the secondary side electronic components are disposed in a region indicated as a secondary side region in FIG. 1A. The transformer 13, the inter-circuit electronic components, and the inter-primary side circuit wire W3 are disposed in a region indicated as an insulation region in FIG. 1A, as also described in a second preferred embodiment shown in FIG. 3B. The insulation region is a region that is located between the primary side region and the secondary side region and that insulates the primary side circuit and the secondary side circuit from each other. The insulation region is provided on the one principal surface of the substrate 1 with a predetermined width that is sufficient to electrically insulate the primary side circuit and the secondary side circuit from each other.

In the present preferred embodiment, among the primary side electronic components, the switching element 3 and the capacitor 4 and a portion of the surface conductor connecting the switching element 3 and the capacitor 4 are disposed between the choke coil 14 and the one principal surface of the substrate 1 with a distance required to ensure insulation from the choke coil 14 being maintained. At this time, the first terminal 14EA and the second terminal 14EB of the choke coil 14 are disposed in the secondary side region, and the support 14D is disposed in the primary side region. Since the support 14D is not electrically connected to the first terminal 14EA and the second terminal 14EB, even though the support 14D is disposed in the primary side region, a short circuit between the primary side circuit and the secondary side circuit does not occur.

That is, in the insulated DC-DC converter 100, since the switching element 3 and the capacitor 4 and the portion of the surface conductor connecting the switching element 3 and the capacitor 4 are disposed in the space below the choke coil 14, the area of the substrate 1 is reduced by the area occupied by the switching element 3, the capacitor 4, and the portion of the surface conductor. As a result, the size of the substrate 1 is reduced, so that it is possible to decrease the occupation area of the insulated DC-DC converter 100 on a motherboard (not shown) on which the insulated DC-DC converter 100 is mounted.

In the insulated DC-DC converter, in the case in which the switching element 3 is disposed in the space below the choke coil 14, the choke coil 14 preferably includes a core. In this case, noise radiated when the switching element 3 is turned ON/OFF is absorbed by the core of the choke coil 14, thus reducing the radiated noise. In addition, a radio wave absorber (not shown) is preferably disposed between the lower surface of the choke coil 14 and the upper surface of the switching element 3. In this case, it is possible to reduce or prevent influence of noise generated from the choke coil 14, on the switching element 3.

In the present preferred embodiment, the case in which the support 14D is a conductor has been described. However, the support 14D may be a nonconductor, such as a resin, for example. In this case, the support 14D may be bonded to the primary side region of the ceramic layer 1C by an adhesive without providing the connection land 1F. In addition, the support 14D may not be joined to the substrate 1 and may be merely brought into contact with the substrate 1. Since the support 14D is a nonconductor, it becomes unnecessary to space the support 14D and the primary side circuit apart from each other in order to insulate the support 14D and the primary side circuit from each other. As a result, the size of the substrate 1 is reduced, so that it is possible to further decrease the occupation area of the insulated DC-DC converter 100 on a motherboard (not shown) on which the insulated DC-DC converter 100 is mounted.

In the present preferred embodiment, the support 14D has been described as being provided to the choke coil 14. However, the support 14D may be a component separate from the choke coil 14. In this case as well, the material of the support 14D may preferably be a conductor, such as Cu, or a nonconductor, such as a resin.

Second Preferred Embodiment

An insulated DC-DC converter 300 according to a second preferred embodiment of the present invention will be described with reference to FIGS. 3A and 3B. The insulated DC-DC converter 300 basically has the same or substantially the same structure as that of the insulated DC-DC converter 100 shown in FIGS. 1A and 1B, but is different from the insulated DC-DC converter 100 in the electronic components disposed in the space below the choke coil 14. The description of the other portions common to the insulated DC-DC converter 100 is omitted.

Figure 3A:
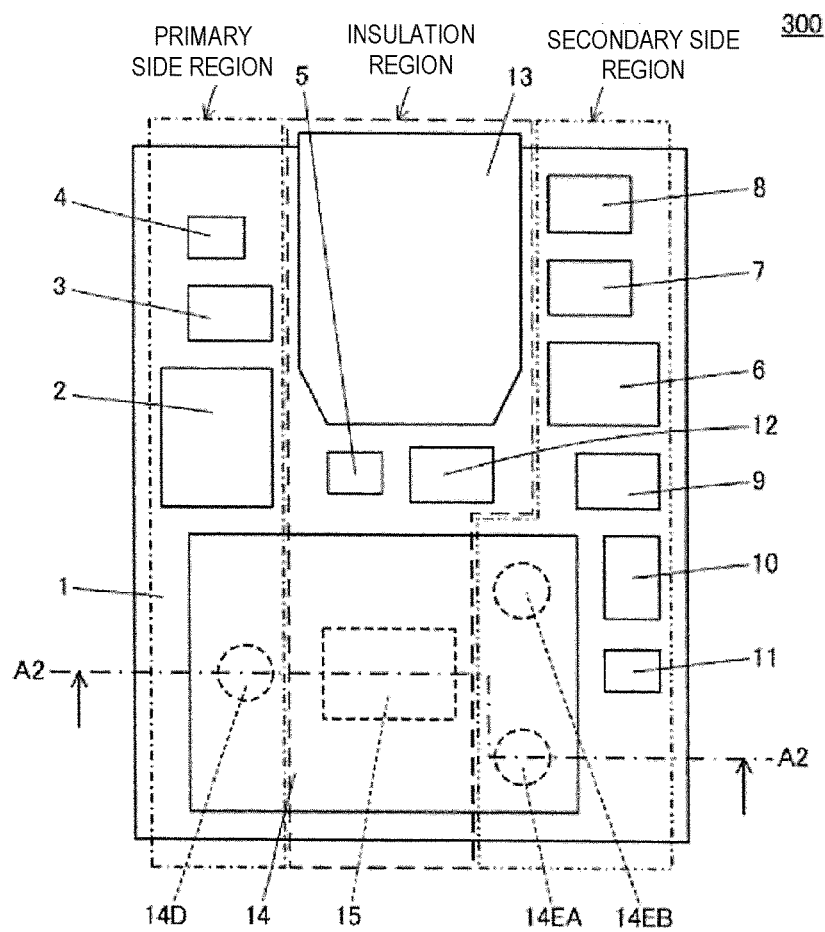
FIG. 3A is a top view and FIG. 3B is a cross-sectional view of an insulated DC-DC converter 300 according to a second preferred embodiment of the present invention.

FIG. 3A is a top view of the insulated DC-DC converter 300. FIG. 3B is cross-sectional view of the insulated DC-DC converter 300 taken along a plane including the line A2-A2 shown in FIG. 3A. In FIG. 3B, similarly to FIG. 1B, elements the cross-sections of which do not appear are not shown. In addition, the circuit configuration of the insulated DC-DC converter 300 shown in FIG. 3A is the same or substantially the same as that of a forward type represented in the circuit diagram 200 shown in FIG. 2, and thus, the description thereof is omitted.

Figure 3B:
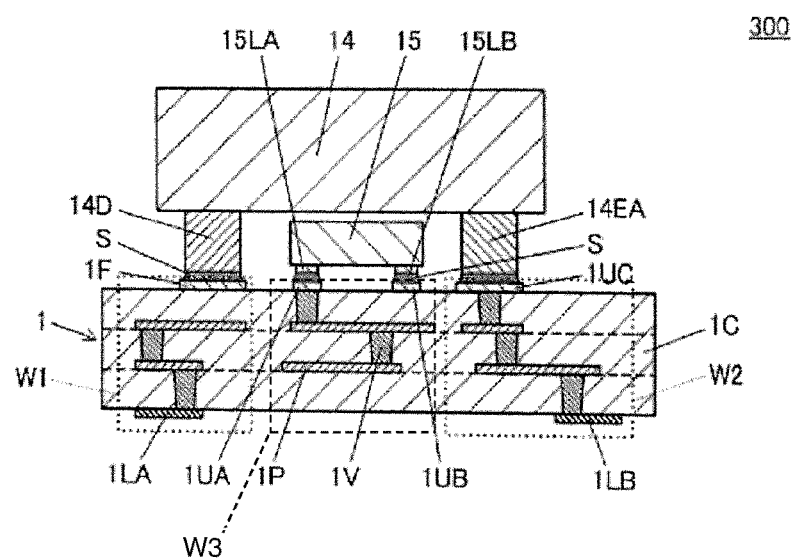

In the present preferred embodiment, as shown in FIG. 3B, among the inter-circuit electronic components, the photocoupler 15 and a portion of the surface conductor of the inter-primary side circuit wire W3 connecting the photocoupler 15 are disposed between the choke coil 14 and the one principal surface of the substrate 1. The positions of the first terminal 14EA, the second terminal 14EB, and the support 14D of the choke coil 14 are the same or substantially the same as in the case of the insulated DC-DC converter 100.

In the insulated DC-DC converter 300, since the photocoupler 15 and the portion of the surface conductor connecting the photocoupler 15 are disposed in the space below the choke coil 14, the area of the substrate 1 is reduced by the area occupied by the photocoupler 15 and the portion of the surface conductor. As a result, the size of the substrate 1 is reduced, so that it is possible to decrease the occupation area of the insulated DC-DC converter 300 on a motherboard (not shown) on which the insulated DC-DC converter 300 is mounted.

In particular, in the present preferred embodiment, since the inter-circuit electronic component (the photocoupler 15 in the present preferred embodiment) is disposed in the space below the choke coil 14 disposed over the insulation region, the insulation region is effectively used. As a result, it is possible to further reduce the size of the substrate 1.

Third Preferred Embodiment

An insulated DC-DC converter 400 according to a third preferred embodiment of the present invention will be described with reference to FIGS. 4 and 5.

Figure 4:
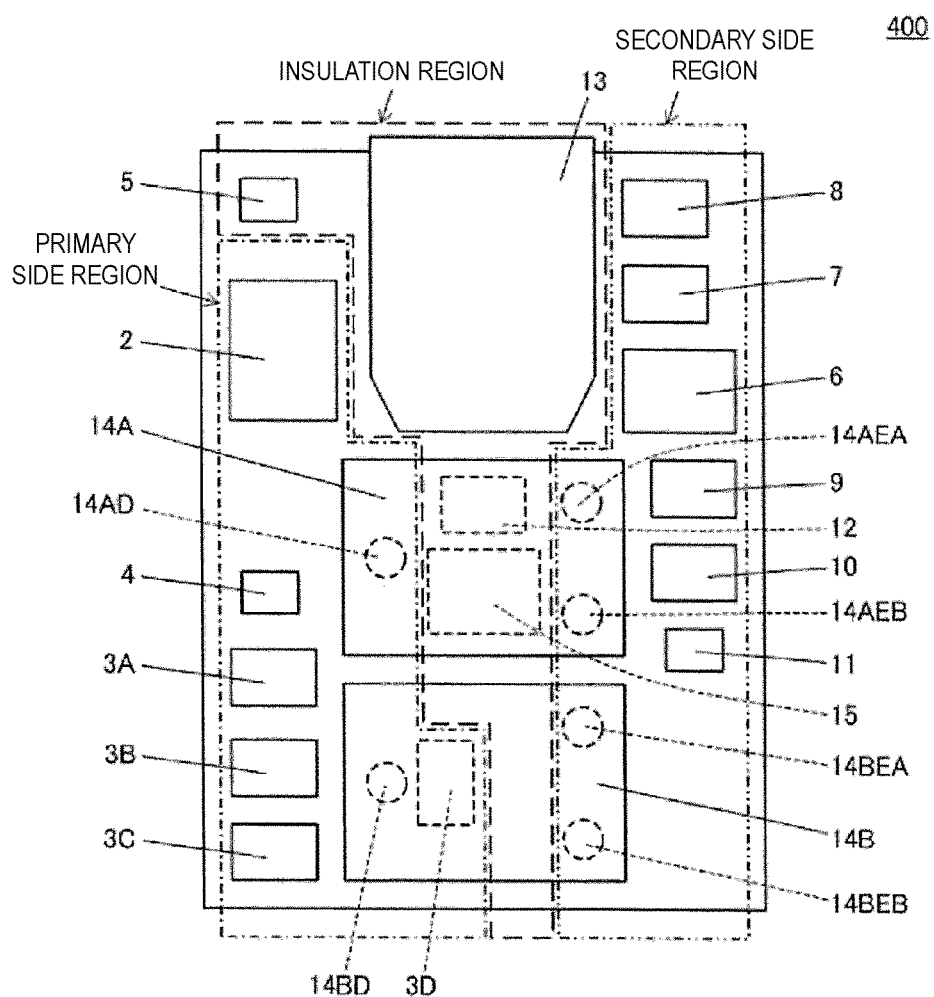
FIG. 4 is a top view of an insulated DC-DC converter 400 according to a third preferred embodiment of the present invention.
Figure 5:
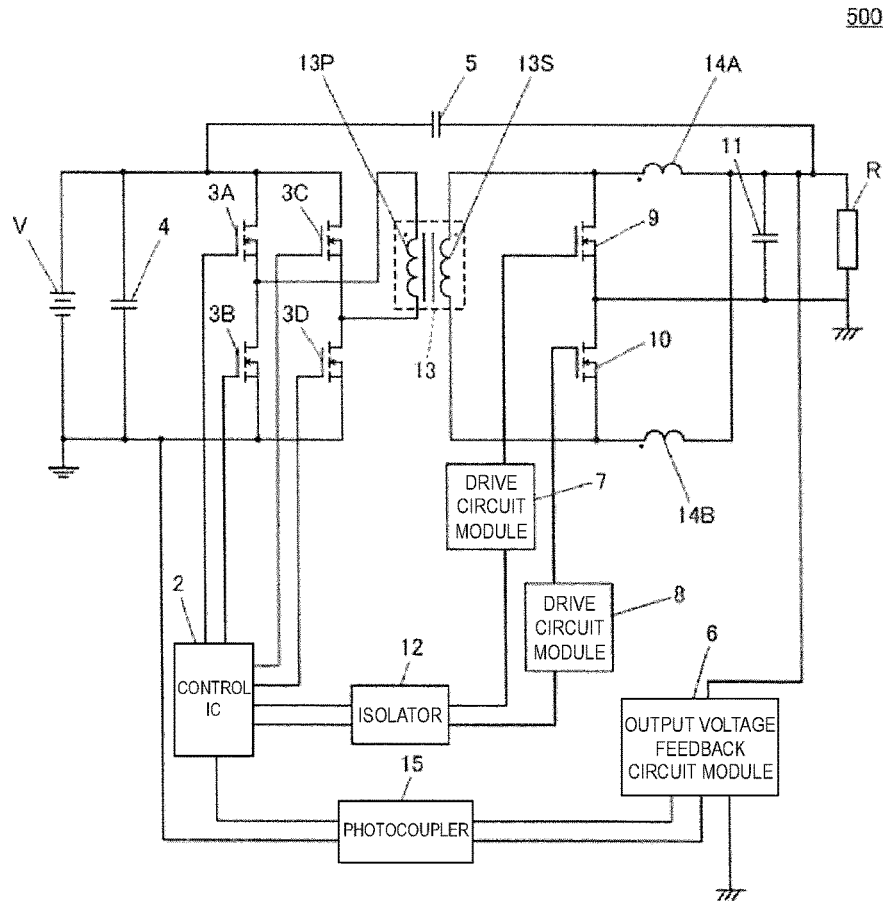
FIG. 5 is a circuit diagram 500 of the insulated DC-DC converter 400 shown in FIG. 4.
Figure 6:
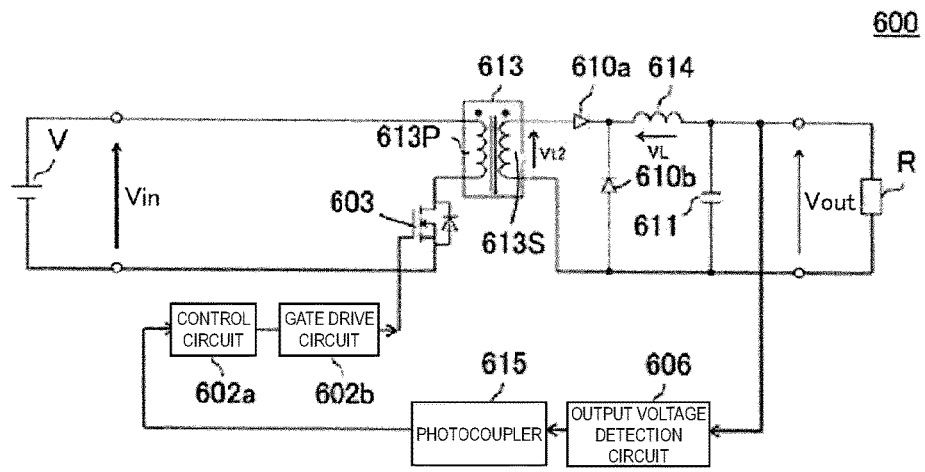
FIG. 6 is a circuit diagram 600 of an insulated DC-DC converter in a background art.

FIG. 4 is a top view of the insulated DC-DC converter 400. A cross-sectional view of the insulated DC-DC converter 400 is not shown. In addition, a circuit diagram 500 shown in FIG. 5 is an example of the circuit diagram of the insulated DC-DC converter 400 shown in FIG. 4 and represents the circuit configuration of a full-bridge type insulated DC-DC converter.

In the full-bridge type insulated DC-DC converter, the primary side circuit is a full-bridge circuit, and the secondary side circuit is a double-current rectification circuit. The full-bridge type insulated DC-DC converter includes four switching elements 3A to 3D as the switching element of the primary side circuit, and two choke coils 14A and 14B as the choke coil of the secondary side circuit.

The choke coil 14A includes a first terminal 14AEA, a second terminal 14AEB, and a support 14AD. The configurations and the materials of each terminal and the support 14AD of the choke coil 14A, and the arrangement thereof on the substrate 1 preferably are the same or substantially the same as in the choke coil 14, and thus the description thereof is omitted. The choke coil 14A is disposed above the one principal surface of the substrate 1 so as to be spaced apart from the one principal surface by the first terminal 14AEA, the second terminal 14AEB, and the support 14AD.

In the present preferred embodiment, similarly to the choke coil 14A, the choke coil 14B includes a first terminal 14BEA, a second terminal 14BEB, and a support 14BD. The choke coil 14B is disposed above the one principal surface of the substrate 1 so as to be spaced apart from the one principal surface by the first terminal 14BEA, the second terminal 14BEB, and the support 14BD. The electronic components other than the above are the same or substantially the same as those in the insulated DC-DC converters 100 and 300, and the description thereof is omitted.

In the present preferred embodiment, among the inter-circuit electronic components, the isolator 12 and the photocoupler 15 and a portion of the surface conductor connecting the isolator 12 and the photocoupler 15 are disposed between the choke coil 14A and the one principal surface of the substrate 1. In addition, among the primary side electronic components, the switching element 3D and a portion of the surface conductor connecting the switching element 3D are disposed between the choke coil 14B and the one principal surface of the substrate 1.

That is, in the insulated DC-DC converter 400, since the isolator 12 and the photocoupler 15 and the portion of the surface conductor connecting the isolator 12 and the photocoupler 15 are disposed in the space below the choke coil 14A, the area of the substrate 1 is reduced by the area occupied by the isolator 12, the photocoupler 15, and the portion of the surface conductor. Similarly, since the switching element 3D and the portion of the surface conductor connecting the switching element 3D are disposed in the space below the choke coil 14B, the area of the substrate 1 is reduced by the area occupied by the switching element 3D and the portion of the surface conductor. As a result, the size of the substrate 1 is reduced, so that it is possible to decrease the occupation area of the insulated DC-DC converter 400 on a motherboard (not shown) on which the insulated DC-DC converter 400 is mounted.

The present invention is not limited to the above-described preferred embodiments, and various applications and modifications may be made within the scope of the present invention. For example, in the preferred embodiments described above, at least one electronic component selected from among the primary side electronic components and the inter-circuit electronic components is disposed in the space below the choke coil. Further, at least one selected from among a portion of the primary side wire and a portion of the inter-primary side circuit wire is disposed in the space below the choke coil, and the electronic components may not be disposed therein.

The shapes, the number, and other structure of supports in the choke coil may be changed as appropriate. Furthermore, the preferred embodiments have been described with a ceramic multilayer substrate as the substrate, but the type of the multilayer substrate is not particularly limited. Moreover, a substrate other than the multilayer substrate, for example, a single-layer substrate made of a resin composite material, such as a glass epoxy substrate, may be used as the substrate. The other components of the insulated DC-DC converter may also be changed as appropriate according to the mechanism and the shape of the insulated DC-DC converter.

For example, another coil may be provided between the choke coil and the one principal surface of the substrate, and the choke coil and the other coil may be magnetically coupled with each other, so as to function as a transformer that detects a voltage between both ends of the choke coil. Accordingly, it is possible to detect the voltage between both ends of the choke coil while reducing or preventing an increase in the mounting area (occupation area).

In the specification, preferred embodiments of the present invention have been described with forward type or and full-bridge type insulated DC-DC converters as examples. However, preferred embodiments of the present invention are applicable to other types of insulated DC-DC converters, such as half-bridge type and push-pull type insulated DC-DC converters, for example.

It is noted that the preferred embodiments described in the specification are illustrative, and components may be partially substituted or changed within the sprite and scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An isolated DC-DC converter comprising:
a substrate including one principal surface and another principal surface;
an isolating transformer including a primary winding and a secondary winding;
a primary side circuit provided at a primary side of the transformer;
a secondary side circuit provided at a secondary side of the transformer;
a choke coil;
an inter-circuit electronic component connecting the primary side circuit and the secondary side circuit and isolating the primary side circuit and the secondary side circuit from each other in a DC manner; and an inter-primary side circuit wire connecting the inter-circuit electronic component and the primary side circuit; wherein the primary side circuit includes the primary winding, a primary side electronic component, and a primary side wire;

the secondary side circuit includes the secondary winding, a secondary side electronic component, the choke coil, and a secondary side wire;

the choke coil includes a first terminal and a second terminal electrically connected to secondary side connection lands on the one principal surface, and a support;

the choke coil is spaced apart from the one principal surface of the substrate by the first terminal, the second terminal, and the support; and at least one of the primary side electronic component and the inter-circuit electronic component, or at least one of a portion of the primary side wire and a portion of the inter-primary side circuit wire, is disposed between the choke coil and the one principal surface of the substrate so as to be spaced apart from the choke coil.

2. The isolated DC-DC converter according to claim 1, wherein when, on the one principal surface of the substrate, a region in which the primary side wire and a connection land electrically connected to the primary side electronic component are disposed is defined as a primary side region, a region in which the secondary side wire and a connection land electrically connected to the secondary side electronic component are disposed is defined as a secondary side region, and a region that is located between the primary side region and the secondary side region and isolates the primary side circuit and the secondary side circuit from each other and in which the transformer, the inter-circuit electronic component, and the inter-primary side circuit wire are disposed is defined as an isolation region; and the choke coil is disposed over the isolation region so as to be spaced apart from the one principal surface of the substrate by the first terminal and the second terminal of the choke coil that are disposed on the secondary side region and the support that is not electrically connected to the first terminal and the second terminal and that is disposed on the primary side region.

3. The isolated DC-DC converter according to claim 1, wherein at least the inter-circuit electronic component is disposed between the choke coil and the one principal surface of the substrate, and the inter-circuit electronic component is at least one of a capacitor, an isolator, and a photocoupler.

4. The isolated DC-DC converter according to claim 1, wherein at least the primary side electronic component is disposed between the choke coil and the one principal surface of the substrate, and the primary side electronic component is a switching element.

5. The isolated DC-DC converter according to claim 4, wherein a radio wave absorber is disposed between the choke coil and the switching element.

6. The isolated DC-DC converter according to claim 1, wherein the secondary side electronic component includes an output voltage feedback circuit module, drive circuit modules, switching elements, a capacitor, and the choke coil.

7. The isolated DC-DC converter according to claim 6, wherein the output voltage feedback circuit module is connected to a control IC of the primary side circuit via a photocoupler and feeds back variations of an output voltage to the control IC.

8. The isolated DC-DC converter according to claim 6, wherein the drive circuit modules are connected to the control IC via an isolator and generate drive signals for the switching elements under control of a control IC of the primary side circuit.

9. The isolated DC-DC converter according to claim 6, wherein the switching elements are FETs.

10. The isolated DC-DC converter according to claim 1, wherein the primary side electronic component includes a control IC, a switching element, and a capacitor.

11. The isolated DC-DC converter according to claim 10, wherein the control IC controls operation of the switching element.

12. The isolated DC-DC converter according to claim 11, wherein the switching element is a FET.

13. The isolated DC-DC converter according to claim 1, wherein the inter-circuit electronic component includes a capacitor, an isolator, and a photocoupler.

14. The isolated DC-DC converter according to claim 13, wherein the capacitor reduces radiation or external transmission of a noise component generated in the isolated DC-DC converter, and causes noise generated in the primary side circuit to flow to the secondary side circuit so as to drop to ground.

15. The isolated DC-DC converter according to claim 13, wherein the isolator exchanges signals between a control IC of the primary side circuit and drive circuit modules of the secondary side circuit in a state of isolating the control IC and the drive circuit modules from each other in a DC manner.

16. The isolated DC-DC converter according to claim 13, wherein the photocoupler optically exchanges signals between a control IC of the primary side circuit and an output voltage feedback circuit module of the secondary side circuit.

* * * * *